US011460351B2

(12) United States Patent
Skifton et al.

(10) Patent No.: US 11,460,351 B2
(45) Date of Patent: Oct. 4, 2022

(54) HIGH-TEMPERATURE, IRRADIATION-RESISTANT THERMOCOUPLE, COAXIAL THERMOCOUPLE, AND RELATED METHODS

(71) Applicant: Battelle Energy Alliance, LLC, Idaho Falls, ID (US)

(72) Inventors: Richard S. Skifton, Idaho Falls, ID (US); Joshua Daw, Idaho Falls, ID (US)

(73) Assignee: Battelle Energy Alliance, LLC, Idaho Falls, ID (US)

(*) Notice: Subject to any disclaimer, the term of this patent is extended or adjusted under 35 U.S.C. 154(b) by 263 days.

(21) Appl. No.: 16/690,630

(22) Filed: Nov. 21, 2019

(65) Prior Publication Data

US 2021/0156747 A1    May 27, 2021

(51) Int. Cl.
*G01K 7/00* (2006.01)
*G01K 7/06* (2006.01)
*H01L 35/32* (2006.01)

(52) U.S. Cl.
CPC ............... *G01K 7/06* (2013.01); *H01L 35/32* (2013.01)

(58) Field of Classification Search
CPC combination set(s) only.
See application file for complete search history.

(56) References Cited

U.S. PATENT DOCUMENTS

| 3,819,420 | A | * | 6/1974 | Schmidt | G01K 7/06 136/228 |
| 5,986,261 | A | * | 11/1999 | Lewis | G01K 7/06 250/306 |
| 7,632,384 | B1 | | 12/2009 | Redey et al. | |
| 9,182,364 | B1 | * | 11/2015 | Condie | G01N 25/18 |
| 2006/0067377 | A1 | * | 3/2006 | Streicher | G01K 7/13 374/110 |
| 2008/0205483 | A1 | * | 8/2008 | Rempe | H01L 35/34 374/179 |

FOREIGN PATENT DOCUMENTS

DE    102008007740 B3 *  7/2009 ............. H01L 35/22

OTHER PUBLICATIONS

EPO Translation of DE-102008007740. (Year: 2009).*
(Continued)

*Primary Examiner* — Lisa M Caputo
*Assistant Examiner* — Nasir U. Ahmed
(74) *Attorney, Agent, or Firm* — TraskBritt

(57) ABSTRACT

A coaxial thermocouple includes a wire, an insulation layer surrounding the wire, a sheath surrounding the insulation layer, and an electrical junction formed between the wire and the sheath and at one longitudinal end of the coaxial thermocouple, the electrical junction including a swaged end with an outer diameter of the sheath reducing in diameter along a longitudinal length of the coaxial thermocouple until the sheath contacts the wire within the insulation layer. The wire includes a first material and the sheath includes a second material where the first material includes one of molybdenum (Mo) or niobium (Nb) and the second material includes the other of molybdenum (Mo) or niobium (Nb).

20 Claims, 5 Drawing Sheets

(56) References Cited

OTHER PUBLICATIONS

Cho et al., "Experimental investigation of combustion and heat transfer in a direct-injection spark ignition engine via instantaneous combustion chamber surface temperature measurements", Proceedings of the Institution of Mechanical Engineers, vol. 222, Part D: J. Automobile Engineering (Nov. 2008) pp. 2219-2233.

Kim et al., "Review of Instrumentation for Irradiation Testing of Nuclear Fuels and Materials", Nuclear Technology, vol. 176 (Nov. 2011) pp. 155-187.

\* cited by examiner

US 11,460,351 B2

HIGH-TEMPERATURE, IRRADIATION-RESISTANT THERMOCOUPLE, COAXIAL THERMOCOUPLE, AND RELATED METHODS

STATEMENT REGARDING FEDERALLY SPONSORED RESEARCH OR DEVELOPMENT

This invention was made with government support under Contract Number DE-AC07-05-ID14517 awarded by the United States Department of Energy. The government has certain rights in the invention.

TECHNICAL FIELD

This disclosure relates generally to coaxial thermocouples for measuring temperatures in high temperature, radioactive environments (e.g., nuclear reactors). In particular, the disclosure further relates to methods of forming and using coaxial thermocouples.

BACKGROUND

Approximation of nuclear reactor temperature is conventionally performed using thermocouples by placing the thermocouples relatively far away from a point of interest and through interpolation and/or extrapolation of two or more thermocouples, an approximation of the temperature can be inferred. In particular, the thermocouples may be placed relatively far from the point of interest (e.g., a reactor vessel) in order to reduce an "observer effect." The foregoing approach often leads to costly mistakes, over redundancy of the experiments, and overly conservative safety margins in power reactors. The costly mistakes, over redundancy, and overly conservative safety margins result exorbitant additional costs to operating the reactors. Additionally, conventional high temperature thermocouples quickly de-calibrate (drift) when exposed to neutron radiation.

SUMMARY

Some embodiments of the present disclosure include a coaxial thermocouple, comprising: a wire, an insulation layer surrounding the wire, a sheath surrounding the insulation layer, and an electrical junction formed between the wire and the sheath and at one longitudinal end of the coaxial thermocouple, the electrical junction comprising a swaged end with an outer diameter of the sheath reducing in diameter along a longitudinal length of the coaxial thermocouple until the sheath contacts the wire within the insulation layer.

Additional embodiments of the present disclosure include a coaxial thermocouple. The coaxial thermocouple may include a wire comprising a first material, an insulation layer surrounding the wire, a sheath surrounding the insulation layer, the sheath comprising a second material, and an electrical junction formed between the wire and the sheath and at one longitudinal end of the coaxial thermocouple, wherein the first material comprises one of molybdenum (Mo) or niobium and the second material comprises the other of molybdenum (Mo) or niobium.

Further embodiments of the present disclosure include a method of forming a coaxial thermocouple. The method may include heating a wire and a sheath of the coaxial thermocouple to at least 1400° C. and maintaining a temperature of the wire and the sheath of the coaxial thermocouple until a threshold event is achieved.

BRIEF DESCRIPTION OF THE DRAWINGS

For a detailed understanding of the present disclosure, reference should be made to the following detailed description, taken in conjunction with the accompanying drawings, in which like elements have generally been designated with like numerals, and wherein.

DETAILED DESCRIPTION

The illustrations presented herein are not actual views of any thermocouple, coaxial thermocouple, or any component thereof, but are merely idealized representations, which are employed to describe embodiments of the present invention.

As used herein, the singular forms following "a," "an," and "the" are intended to include the plural forms as well, unless the context clearly indicates otherwise.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features, and methods usable in combination therewith should or must be excluded.

As used herein, any relational term, such as "first," "second," etc., is used for clarity and convenience in understanding the disclosure and accompanying drawings, and does not connote or depend on any specific preference or order, except where the context clearly indicates otherwise.

As used herein, the term "substantially" in reference to a given parameter, property, or condition means and includes to a degree that one skilled in the art would understand that the given parameter, property, or condition is met with a small degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" used in reference to a given parameter is inclusive of the stated value and has the meaning dictated by the context (e.g., it includes the degree of error associated with measurement of the given parameter, as well as variations resulting from manufacturing tolerances, etc.).

Embodiments of the present disclosure include coaxial thermocouples having a single wire grounded to an outer sheath. The coaxial thermocouples may form high temperature, irradiation-resistant thermocouples that enable radiation hardened temperature probes to be more compactly positioned within reactors during temperature measurements. The coaxial thermocouples may be relatively compact, which may reduce perturbation experienced by the coaxial thermocouples when sensing an environment. As is discussed in greater detail below, the coaxial thermocouples of the present disclosure have shown to withstand both the high temperatures (e.g., >1200° C.) and high radiation (e.g., neutron) of nuclear reactor fuel design tests and/or over-temperature accident conditions. The coaxial thermocouples of the present disclosure may exhibit relatively fast response times and may continue to operate when conventional thermocouples would drift and/or be rendered inoperable due to neutron exposure.

Figure 1A:
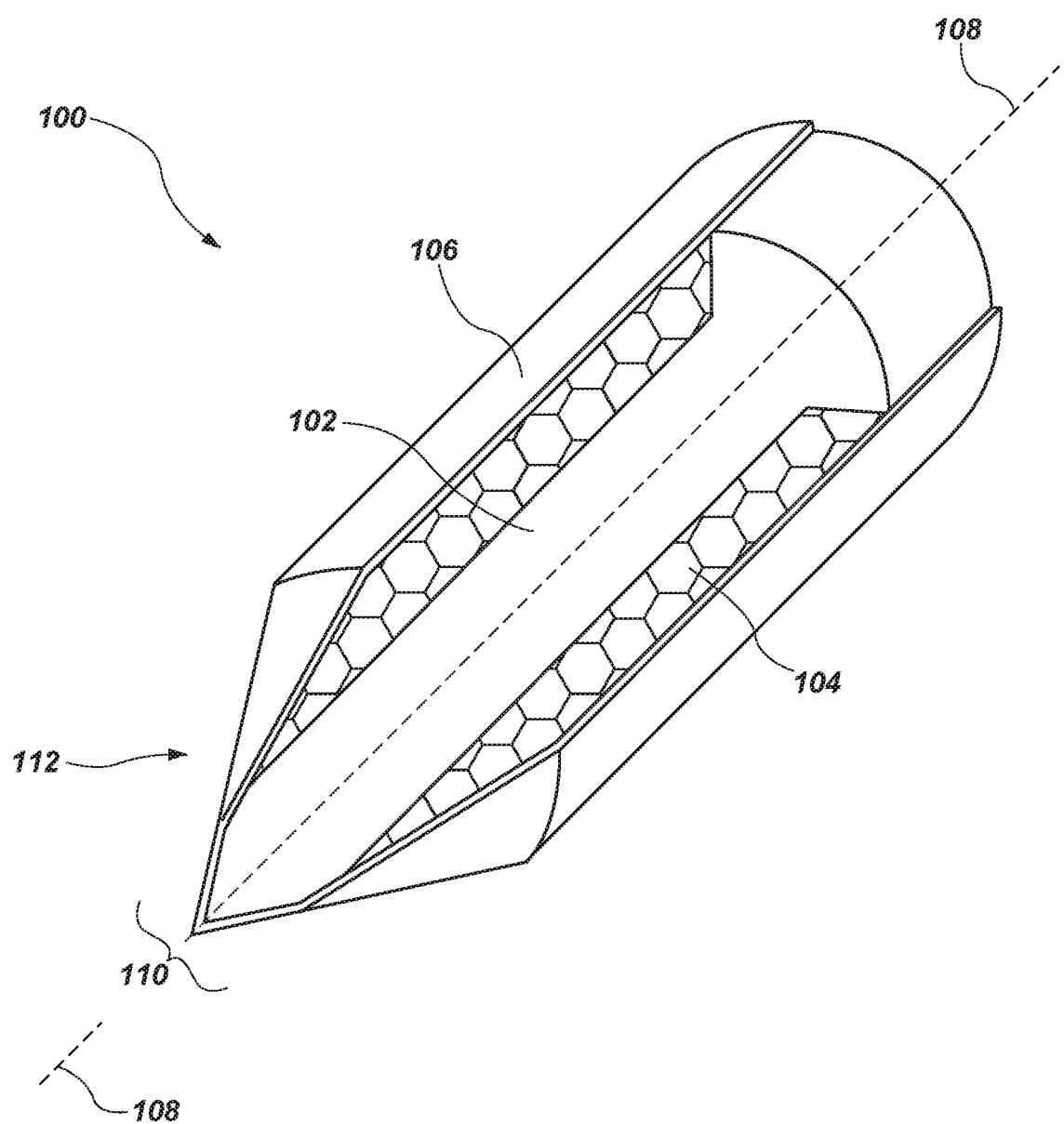
FIG. 1A illustrates a schematic diagram of a coaxial thermocouple in accordance with one or more embodiments of the present disclosure.
Figure 1B:
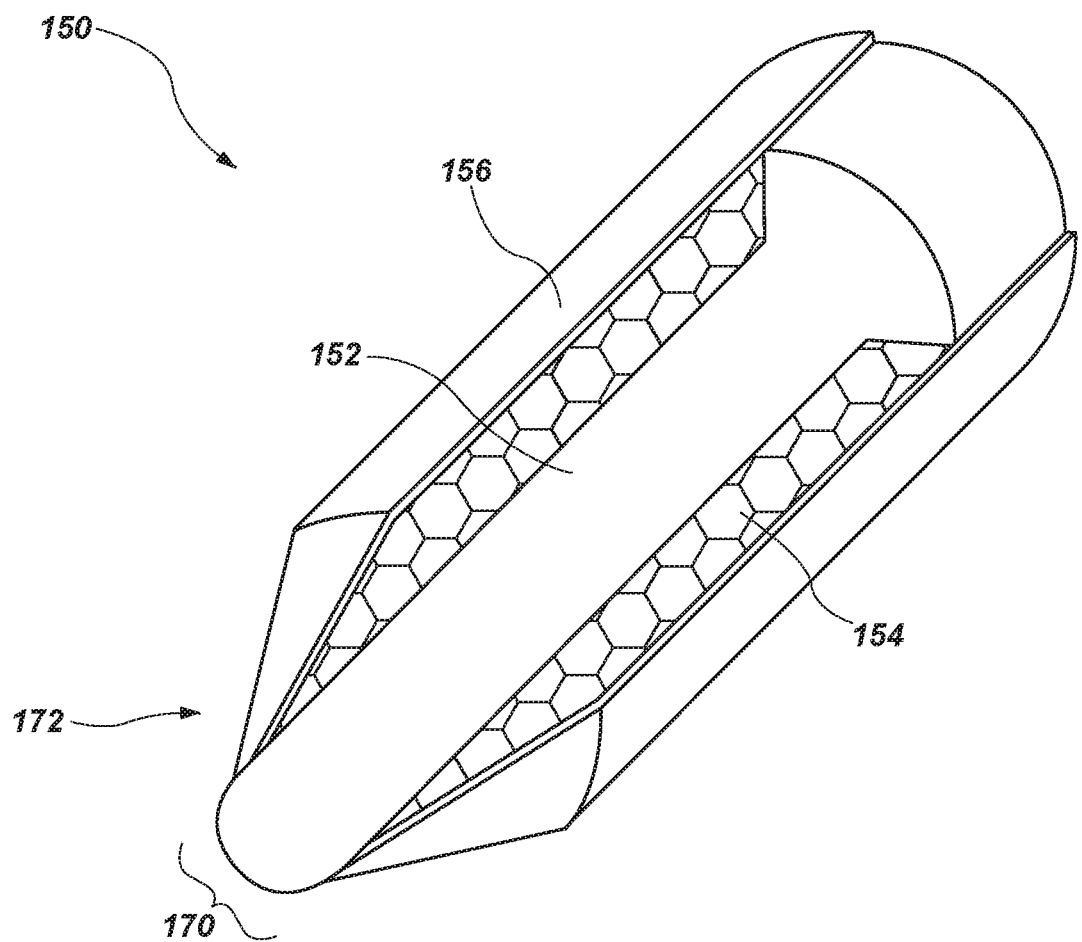
FIG. 1B illustrates a schematic diagram of a coaxial thermocouple in accordance with one or more additional embodiments of the present disclosure.

FIG. 1A shows a coaxial thermocouple 100 according to one or more embodiments of the present disclosure. In some embodiments, the coaxial thermocouple 100 may include a wire 102, an insulation layer 104, and a sheath 106. The insulation layer 104 may surround the wire 102, and the sheath 106 may surround the insulation layer 104. Furthermore, the wire 102 and the sheath 106 may be coaxial. In other words, the wire 102 and the sheath 106 may share a center longitudinal axis 108. In one or more embodiments, the wire 102 and the sheath 106 may be connected via an electrical junction 110. For instance, the coaxial thermocouple 100 may include a swaged end 112, and an outer diameter of the sheath 106 may reduce along the center longitudinal axis 108 near the longitudinal end of the coaxial thermocouple 100 until the sheath 106 contacts the wire 102. In some embodiments, the swaged end 112 may include the sheath 106 being swaged onto and over the wire 102 to form a point and at least substantially fully covering the wire 102. In other embodiments, the wire 102 may be exposed (FIG. 1B). The swaged end 112 is described in further detail in regard to FIGS. 1B and 2.

In one or more embodiments, the wire 102 may form a first element of the coaxial thermocouple 100, and the sheath 106 may form a second element of the coaxial thermocouple 100. Furthermore, the wire 102 may include an electrical conductor dissimilar from an electrical conductor of the sheath 106. As a result, the dissimilar materials of the first and second elements (i.e., the wire and the sheath 106) may form differing temperatures at the swaged end 112 (i.e., the electrical junction). Due to the differing temperatures of the dissimilar materials at the electrical junction, the coaxial thermocouple 100 may produce a temperature dependent voltage as a result of the thermoelectric effect, and as is known in the art, the produced voltage may be interpreted to measure a temperature.

In some embodiments, the wire 102 may include molybdenum (Mo) and the sheath 106 may include niobium (Nb). In other embodiments, the wire 102 may include niobium (Nb) and the sheath 106 may include molybdenum (Mo). In some instances, the niobium (Nb) and/or the molybdenum (Mo) may be at least substantially pure (i.e., 100%) niobium (Nb) and/or molybdenum (Mo) within the restraints of material purification processes. In some embodiments, either the wire 102 or the sheath 106 may include a molybdenum-niobium alloy. For instance, either the wire 102 or the sheath 106 may include a molybdenum-niobium alloy with between about 0% and about 15% niobium (Nb) by mass. For example, the molybdenum-niobium alloy may include about 10% niobium (Nb) by mass. In other embodiments, either the wire 102 or the sheath 106 may include a niobium-molybdenum alloy. For instance, either the wire 102 or the sheath 106 may include a niobium-molybdenum alloy with between about 0% and about 15% molybdenum (Mo) by mass. For example, the niobium-molybdenum alloy may include about 10% molybdenum (Mo) by mass.

Because the coaxial thermocouple 100 may include molybdenum (Mo), niobium (Nb), molybdenum-niobium alloys, and/or niobium-molybdenum alloys as the wire 102 and/or the sheath 106, the coaxial thermocouple 100 may be advantageous over conventional thermocouples. For example, molybdenum (Mo) and niobium (Nb) and associated alloys exhibit relatively high melting temperatures. As a result of the high melting temperatures of the wire 102 and the sheath 106 of the coaxial thermocouple 100, the coaxial thermocouple 100 may be utilized in high temperature environments (e.g., nuclear reactors, high temperature drilling operations, aircraft, space craft, etc.).

Furthermore, molybdenum (Mo), niobium (Nb), molybdenum-niobium alloys, and/or niobium-molybdenum alloys exhibit relatively low neutron absorption cross-sections. As a result, the wire 102 and the sheath 106 may exhibit relatively high irradiation resistances in comparison to conventional thermocouples. For example, the effective cross-sectional areas of the atoms within the wire 102 and the sheath 106 that are presented to absorption are relatively small, and the probability that atoms of the wire 102 and the sheath 106 will capture neutrons is relatively low. Due to the low neutron absorption cross-sections of the wire 102 and the sheath 106, the coaxial thermocouple 100 of the present disclosure may provide advantages over conventional thermocouples. For example, within radioactive environments, when conventional thermocouples would be rendered inoperable due to neutron absorption and the atoms of the elements of the conventional thermocouples changing isotopes, the coaxial thermocouple 100 of the present disclosure remains functional and operational.

Moreover, the molybdenum (Mo), niobium (Nb), molybdenum-niobium alloys, and/or niobium-molybdenum alloys exhibit sufficiently-high ductility to enable relatively fast and effective manufacturing of the coaxial thermocouple 100 of the present disclosure, as is discussed in further detail below.

Referring still to FIG. 1A, in one or more embodiments, one or more of the materials forming the wire 102 and/or the sheath 106 may include a dopant. For example, in some embodiments, either the wire 102 or the sheath 106 may include molybdenum (Mo) doped within Lanthanum (La) oxide. In one or more embodiments, either the wire 102 or the sheath 106 may include molybdenum (Mo) doped with Lanthanum (La) oxide by an amount within a range of about 0% and about 2% by weight. In some embodiments, the wire 102 or the sheath 106 may include molybdenum (Mo) doped with Lanthanum (La) oxide by an amount of about 1% by weight. In additional embodiments, either the wire 102 or the sheath 106 may include molybdenum (Mo) doped with one or more of potassium (K), silicate $(SiO_4)^{4-}$, tungsten (W), or silicon (Si). In such embodiments, either the wire 102 or the sheath 106 may include molybdenum (Mo) doped with one or more of potassium (K), silicate $(SiO_4)^{4-}$, tungsten (W), or silicon (Si) by an amount within a range of about 100 ppm and about 300 ppm per dopant. In further embodiments, either the wire 102 or the sheath 106 may include niobium (Nb) doped with phosphorus (P). For example, either the wire 102 or the sheath 106 may include niobium (Nb) doped with phosphorus (P) by an amount within a range of 700 μg/g and about 1300 μg/g. In some embodiments, either the wire 102 or the sheath 106 may include niobium (Nb) doped with phosphorus (P) by an amount of about 1000 μg/g. In yet further embodiments, either the wire 102 or the sheath 106 may include niobium (Nb) doped with zirconium (Zr). For example, either the wire 102 or the sheath 106 may include niobium (Nb) doped with zirconium (Zr) by an amount within a range of about 0% to about 2% by weight. In some embodiments, either the wire 102 or the sheath 106 may include niobium (Nb) doped with zirconium (Zr) by an amount of about 1% by weight.

Doping the materials of the wire 102 and/or the sheath 106 with the dopants describe herein may reduce a brittleness of the wire 102 and/or the sheath 106. As a result, the dopants may improve a durability of coaxial thermocouple 100 and may increase a lifetime of the coaxial thermocouple 100.

In one or more embodiments, the insulation layer 104 may include a ceramic. For example, the insulation layer 104 may include one or more of Alumina ($Al_2O_3$), Magnesia (MgO), Hafnia ($HfO_2$), Silica ($SiO_2$), Zirconia ($ZrO_2$), or Yttria ($Y_2O_3$).

Referring still to FIG. 1A, the coaxial thermocouple 100 of the present disclosure may be advantageous over conventional thermocouples. For example, due to the coaxial construction of the coaxial thermocouple 100 and the construction of the swaged end 112 (i.e., electrical junction) of the coaxial thermocouple 100, the coaxial thermocouple 100 may be significantly smaller than conventional thermocouples. In particular, forming the coaxial thermocouple 100 as a cable (i.e., the combination of the wire 102, the insulation layer 104, and the sheath 106) and forming the swaged end 112 at an end of the cable further enables smaller diameters of the overall coaxial thermocouple 100. For example, in some embodiments, the coaxial thermocouple 100 may have an outer diameter (e.g., an outer diameter of the sheath 106) within a range of about 0.1 mm and about 3.175 mm. For instance, the coaxial thermocouple 100 may have an outer diameter of about 0.25 mm. One of ordinary skill in the art will readily recognize that larger applications fall within the scope of the present disclosure as well. For example, in other embodiments, the coaxial thermocouple 100 may have an outer diameter of about 1 mm, 1 cm, 5 cm, 10 cm, or any other desired size.

Additionally, as is known in the art, response times of thermocouples are associated with a size of the elements of the thermocouple, and as a result, the overall outer perimeter (e.g., diameter) of the thermocouple. Furthermore, the relatively fine tip of the swaged end 112 (i.e., electrical junction) of the coaxial thermocouple 100 may behave like an exposed junction thermocouple and may assimilate to surrounding temperatures relatively quick, thus enabling even faster response times. As a result, the thermocouple of the present disclosure may provide faster response times than conventional thermocouples. For example, in some embodiments, the coaxial thermocouple 100 of the present disclosure may exhibit a response time with a range of one third and about one half of the response time of a conventional thermocouple. For instance, the coaxial thermocouple 100 of the present disclosure may exhibit a response time of less than 0.125 seconds, than 0.08 seconds, less than 0.04 seconds, or less than 0.02 seconds.

Furthermore, the coaxial thermocouple 100 of the present disclosure may be easier to manufacture than conventional thermocouples (e.g., a K-type thermocouple). In particular, due to the construction of the coaxial thermocouple 100 and the materials used as the wire 102, the insulation layer 104, and the sheath 106, long lengths (e.g., spools) of cabling (e.g., 35 meters, 50 meters, 100 meters, etc., of cabling) including the wire 102, the insulation layer 104, and the sheath 106 may be formed, and subsequently, smaller lengths of cabling may merely be cut (e.g., cut to size) from the long lengths of cabling, and a longitudinal end of a smaller length may be swaged (as described herein) to form the coaxial thermocouple 100. As a result, the coaxial thermocouple 100 of the present disclosure may be easily and quickly formed and may be customizable in length for given applications. In view of the foregoing, coaxial thermocouples 100 of the present disclosure may reduce manufacturing time, may utilize less material, and may reduce costs of manufacturing in comparison to conventional thermocouples.

FIG. 1B shows a coaxial thermocouple 150 according to one or more embodiments of the present disclosure. The coaxial thermocouple 150 may include a wire 152, an insulation layer 154, and a sheath 156 similar to the coaxial thermocouple 100 of FIG. 1A. However, a swaged end 172 of the coaxial thermocouple 150 may include a frustum (e.g., a frustoconical shape) such that the wire 152 of the coaxial thermocouple 150 is exposed and the sheath 156 is just swaged onto the wire 152 to form an electrical junction 170.

Figure 2:
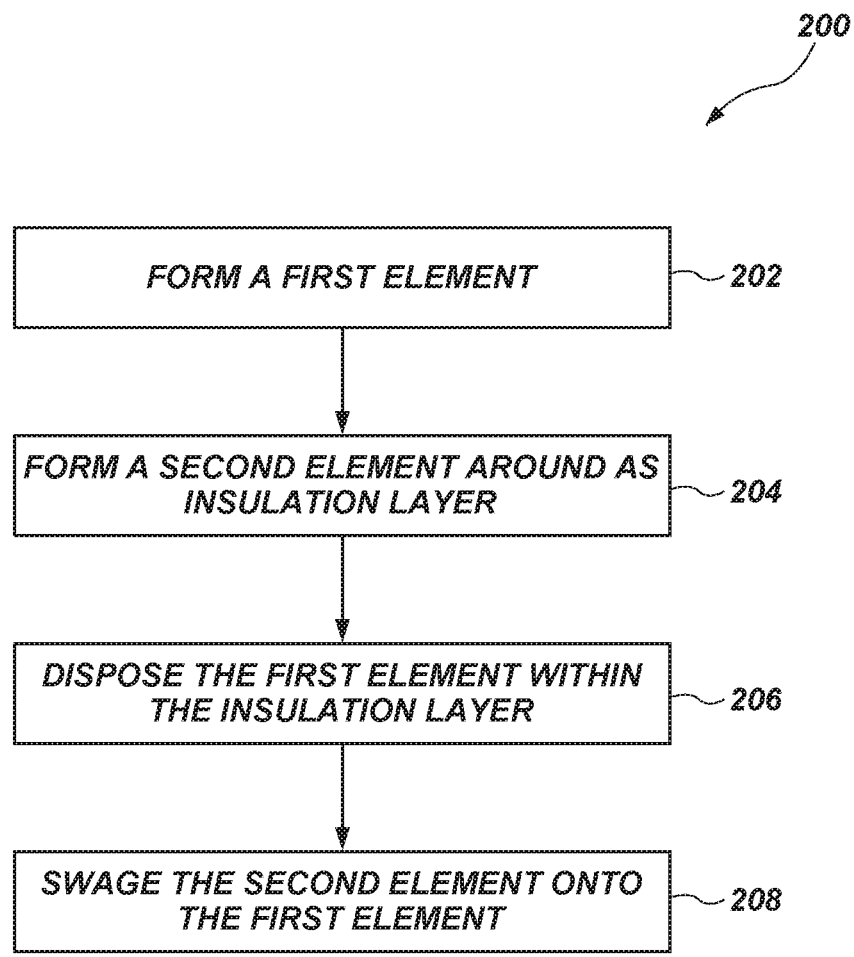
FIG. 2 shows a flow chart of a method of forming a coaxial thermocouple according to one or more embodiments of the present disclosure.

FIG. 2 shows a flow chart of a method 200 of forming a coaxial thermocouple according to one or more embodiments of the present disclosure. In some embodiments, the method 200 may include forming a first element of the coaxial thermocouple, as shown in act 202 of FIG. 2. Forming the first element of the coaxial thermocouple may include forming a wire. For example, forming the first element of the coaxial thermocouple may include any of the wires (e.g., wire 102) described above in regard to FIG. 1. Furthermore, act 202 may include forming the first element of a first material. For instance, forming the first element of the coaxial thermocouple may include forming the wire to include molybdenum (Mo), niobium (Nb), molybdenum-niobium alloys, and/or niobium-molybdenum alloys. Moreover, forming the first element of the coaxial thermocouple may include forming the wire to include one or more dopants such as, for example, Lanthanum (La) oxide, potassium (K), silicate $(SiO_4)^{4-}$, tungsten (W), silicon (Si), phosphorus (P), or zirconium (Zr). In one or more embodiments, forming the first element may include forming a wire via any known manner.

The method 200 may further include forming a second element of the thermocouple around an insulation layer, as shown in act 204 of FIG. 2. In one or more embodiments, forming the second element of the thermocouple may include forming and/or disposing a sheath around a cylindrical insulation layer. For example, forming the second element of the thermocouple may include forming the second element to include any of the sheaths (e.g., sheath 106) described above in regard to FIG. 1. Furthermore, act 204 may include forming the second element of a second material, dissimilar to the first element of the wire. For instance, forming the second element of the coaxial thermocouple may include forming the sheath to include molybdenum (Mo), niobium (Nb), molybdenum-niobium alloys, and/or niobium-molybdenum alloys. Moreover, forming the second element of the coaxial thermocouple may include forming the sheath to include one or more dopants such as, for example, Lanthanum (La) oxide, potassium (K), silicate $(SiO_4)^{4-}$, tungsten (W), silicon (Si), phosphorus (P), or zirconium (Zr). In one or more embodiments, forming the second element may include forming a sheath and surrounding the insulation layer with the sheath via any known manner. For instance, forming the second element may include forming cabling via known methods.

The method 200 may also include disposing the first element within the insulation layer, as shown in act 206 of FIG. 2. For example, disposing the first element within the insulation layer may include threading the wire through an aperture in the insulation layer. In one or more embodiments, disposing the first element within the insulation layer may occur before forming the second element over the insulation layer. For instance, in one or more embodiments, the insulation layer may be extruded over the first element.

Referring to acts 202 and 204 together, in some embodiments, acts 202 and 204 may include forming coaxial cabling to include any of the materials described herein via conventional methods. In some embodiments, acts 202 and 204 may include forming coaxial cabling to have an outer diameter (e.g., an outer diameter of the sheath) within a range of about 0.1 mm and about 0.5 mm. For instance, the coaxial thermocouple 100 may have an outer diameter of about 0.25 mm.

Furthermore, the method 200 may include swaging the second element of the thermocouple onto the first element, as shown in act 208 of FIG. 2. For example, act 208 may include swaging a longitudinal end of cabling having the first and second elements (e.g., the wire and the sheath). In some embodiments, swaging the longitudinal end of the cabling may include pressing the longitudinal end of the cabling into one or more dies (e.g., a series of dies, one or more swages). In some embodiments, swaging the longitudinal end of the cabling may include reducing an outer diameter of the second element (e.g., the sheath) until the second element contacts the first element (e.g., the wire). In other words, swaging the longitudinal end of the cabling may include swaging the sheath onto the wire of the coaxial thermocouple. In some embodiments, the swaging the longitudinal end of the cabling may include swaging the sheath onto the wire of the coaxial thermocouple to form a point (as shown in FIG. 1A), and in other embodiments, the swaging the longitudinal end of the cabling may include swaging the sheath onto the wire of the coaxial thermocouple to form a frustum (e.g., a frustoconical shape) (as shown in FIG. 1B). In one or more embodiments, act 208 may include a cold working process. In other embodiments, act 208 may include a hot working process.

As noted above, the swaged end of the coaxial thermocouple of the present disclosure provides advantages over conventional thermocouples. For example, the relatively fine tip of the swaged end (i.e., electrical junction) of the coaxial thermocouple may behave like an exposed junction thermocouple and may assimilate to surrounding temperatures relatively quick, thus enabling even faster response times. As a result, the thermocouple of the present disclosure may provide faster response times in comparison to conventional thermocouples.

Figure 3:
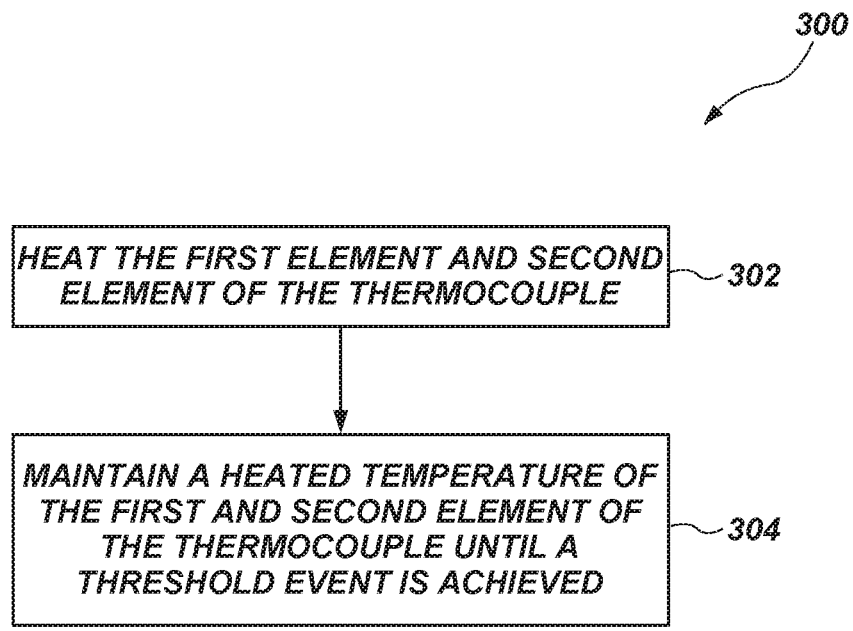
FIG. 3 shows a flow chart of a method of heat treating elements of a coaxial thermocouple according to one or more embodiments of the present disclosure.

FIG. 3 shows a flow chart of a method 300 of heat treating a thermocouple according to one or more embodiments of the present disclosure. In one or more embodiments, the method 300 may include heating a first element (e.g., a wire) and a second element (e.g., a sheath) of the coaxial thermocouple to a threshold temperature, as shown in act 302 of FIG. 3. In some embodiments, the threshold temperature may be at least 1400° C. In additional embodiments, the threshold temperature may be at least 1500° C., 1600° C., or 1700° C. In further embodiments, the threshold temperature may be an anticipated operating temperature of the coaxial thermocouple (e.g., a temperature to which the coaxial thermocouple is expected to be subjected during use).

The method 300 may further include maintaining the heated temperature of the first element (e.g., a wire) and the second element (e.g., a sheath) of the coaxial thermocouple until a threshold event is achieved, as shown in act 304 of FIG. 3. In some embodiments, the threshold event may include at least five, six, seven, or eight hours elapsing while maintaining the heated temperature. In other embodiments, the threshold event may include the coaxial thermocouple exhibiting a fitted electromotive force (EMF) curve of the coaxial thermocouple that reaches a d(Voltage)/d(time[hr]) of less than 0.001 at operating temperatures (e.g., 1400° C.) of the coaxial thermocouple. In additional embodiments, the threshold event may include the coaxial thermocouple exhibiting an EMF curve of the coaxial thermocouple that reaches a d(Voltage)/d(time[hr]) of less than 0.002. The EMF curve is described in further detail below in regard to FIG. 5.

In one or more embodiments, achieving the threshold event may include changing a grain structure of the first element (e.g., the wire) and a grain structure of the second element (e.g., the sheath) to second grain structures, which cause the thermocouple to exhibit the above-described EMF curve. For example, in some embodiments, achieving the threshold event may include stabilizing grain structures of the first and second elements.

Referring still to FIG. 3, in some embodiments, the first element (e.g., the wire) and the second element (e.g., the sheath) may be heat treated together (e.g., at the same time). In other embodiments, the first element (e.g., the wire) and the second element (e.g., the sheath) may be heat treated separately. In one or more embodiments, when the coaxial thermocouple is formed as cabling, the cabling may be heat treated in portions, and the first element (e.g., the wire) and the second element (e.g., the sheath) of the portions of the cabling may be heat treated at a sufficient enough length that the anticipated operating temperature gradient zone is within the heat treated state of the wire and sheath.

Figure 4:
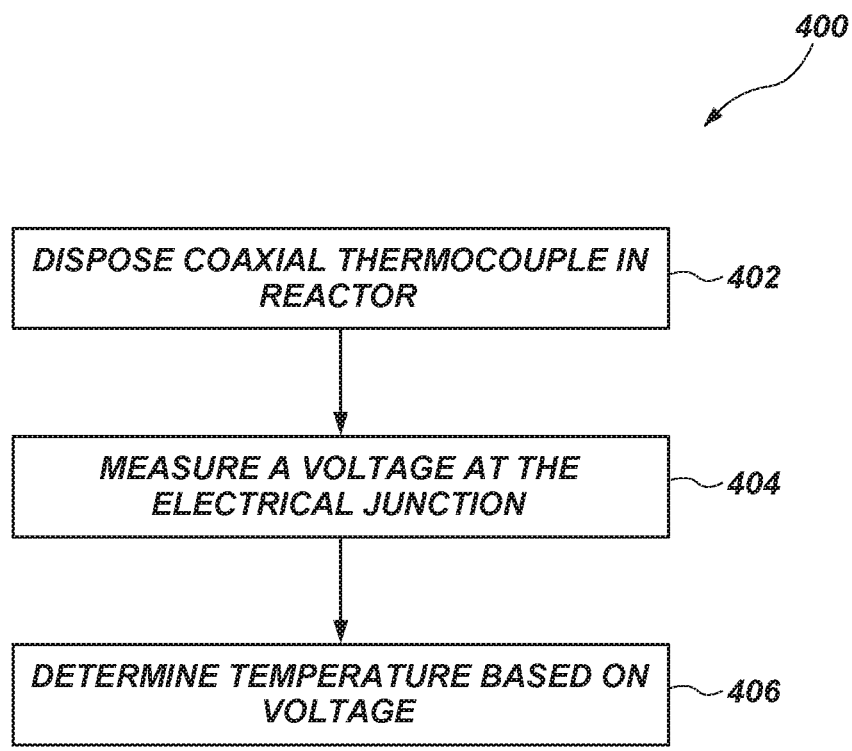
FIG. 4 shows a flow chart of a method of measuring a temperature of a nuclear reactor with a thermocouple according to one or more embodiments of the present disclosure.

FIG. 4 shows a flow chart of a method 400 of measuring a temperature within a nuclear reactor utilizing a coaxial thermocouple. In some embodiments, the method 400 includes disposing a coaxial thermocouple within a nuclear reactor, as shown in act 402 of FIG. 4. For example, act 402 may include disposing the coaxial thermocouple within a reactor vessel, a reactor coolant system, or any other portion of a nuclear reactor system. In some embodiments, the nuclear reactor system may include a conventional pressurized water reactor (PWR), a Magnox, an advanced gas-cooled, a boiling water reactor, a Canada Deuterium Uranium, or a graphite-moderated (e.g., RBMK) reactor system.

The coaxial thermocouple may include any of the coaxial thermocouples described herein. For example, the coaxial thermocouple may include a wire, an insulation layer, and a sheath. Furthermore, the coaxial thermocouple may include any of the swaged ends described herein. Moreover, the wire, the insulation layer, and the sheath may include any of the materials described above in regard to FIGS. 1-3.

Upon disposing the coaxial thermocouple within the nuclear reactor, the method 300 may include measuring a voltage generated at the electrical junction (i.e., the swaged end) of the coaxial thermocouple, as shown in act 404 of FIG. 4. For example, act 404 may include measuring the generated voltage via any conventional method.

Furthermore, the method may include determining a temperature based on the measured voltage, as shown in act 406 of FIG. 4. For instance, act 406 may include determining a temperature based on the measured voltage via any conventional manner.

Figure 5:
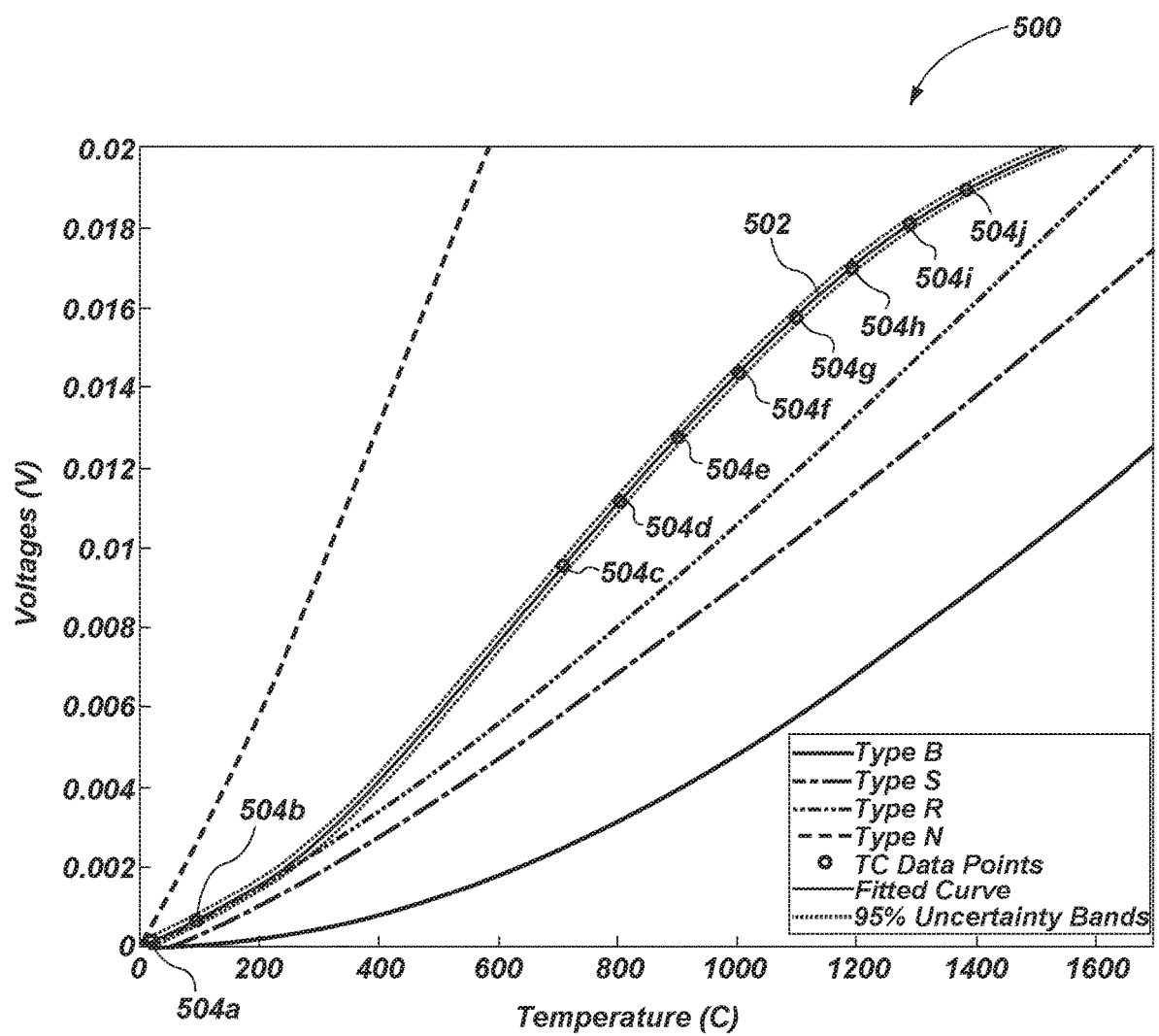
FIG. 5 shows a graph of an electromotive force curve exhibited by coaxial thermocouples of the present disclosure.

FIG. 5 shows a graph 500 having an EMF curve 502 exhibiting properties of coaxial thermocouples of the present disclosure in comparison to other conventional types of thermocouples. As shown in the graph 500, a fifth order polynomial curve is fitted to measured data points 504a-504j of coaxial thermocouple of the present disclosure. Furthermore, in the example depicted in FIG. 5, the fifth order polynomial curve exhibits a leveling off achieving a d(Voltage)/d(time[hr]) within a range of less than 0.001 and less than 0.002 at above about 1400° C.

While a fifth order polynomial curve is depicted in FIG. 5, other polynomials may be fitted to the measured data points, and in some embodiments, a reference table and interpolated values can also be utilized in analyzing measured data points.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternate useful combinations of the elements described, will become apparent to those skilled in the art from the description. Such modifications and embodiments also fall within the scope of the appended claims and equivalents.

What is claimed is:

1. A coaxial thermocouple, comprising:
   a wire;
   an insulation layer surrounding the wire;
   a sheath surrounding the insulation layer; and
   an electrical junction formed between the wire and the sheath and at one longitudinal end of the coaxial thermocouple, the electrical junction comprising a swaged end with an outer diameter of the sheath reducing in diameter along a longitudinal length of the coaxial thermocouple until an inner diameter of the sheath is substantially the same as an outer diameter of the wire and the sheath contacts the wire within the insulation layer.

2. The coaxial thermocouple of claim 1, wherein the wire comprises one of molybdenum (Mo) or niobium (Nb), and wherein the sheath comprises the other of molybdenum (Mo) or niobium (Nb).

3. The coaxial thermocouple of claim 1, wherein an outer diameter of the coaxial thermocouple is within a range of about 0.1 mm and about 3.175 mm.

4. The coaxial thermocouple of claim 3, wherein the outer diameter of the coaxial thermocouple is about 0.254 mm.

5. The coaxial thermocouple of claim 1, wherein the coaxial thermocouple exhibits a polynomial fitted electromotive force curve of output voltage vs. temperature.

6. The coaxial thermocouple of claim 1, wherein each of the wire and the sheath are doped with a dopant reducing a brittleness of the wire and the sheath.

7. A coaxial thermocouple, comprising:
   a wire comprising a first material;
   an insulation layer surrounding the wire;
   a sheath surrounding the insulation layer, the sheath comprising a second material; and
   an electrical junction formed between the wire and the sheath and at one longitudinal end of the coaxial thermocouple, the electrical junction comprising a swaged end with an outer diameter of the sheath reducing in diameter along a longitudinal length of the coaxial thermocouple until an inner diameter of the sheath is substantially the same as an outer diameter of the wire and the sheath contacts the wire;
   wherein the first material comprises one of molybdenum (Mo) or niobium (Nb) and the second material comprises the other of molybdenum (Mo) or niobium (Nb).

8. The coaxial thermocouple of claim 7, wherein the wire comprises molybdenum (Mo) and the sheath comprises niobium (Nb).

9. The coaxial thermocouple of claim 8, wherein electrical junction comprises a swaged end with an outer diameter of the sheath reducing in diameter along a longitudinal length of the coaxial thermocouple until the sheath contacts the wire within the insulation layer.

10. The coaxial thermocouple of claim 7, wherein the wire comprises molybdenum (Mo) doped with Lanthanum (La) oxide by an amount within a range of about 0% and about 2% by weight.

11. The coaxial thermocouple of claim 7, wherein the wire comprises molybdenum (Mo) doped with one or more of potassium (K), silicate $(SiO_4)^{4-}$, tungsten (W), or silicon (Si) by an amount within a range of about 100 ppm and about 300 ppm per dopant.

12. The coaxial thermocouple of claim 7, wherein sheath comprises niobium (Nb) doped with phosphorus (P) by an amount within a range of about 700 µg/g and about 1300 µg/g.

13. The coaxial thermocouple of claim 7, wherein sheath comprises niobium (Nb) doped with zirconium (Zr) by an amount within a range of about 0% and about 2% by weight.

14. The coaxial thermocouple of claim 7, wherein the wire comprises a molybdenum-niobium alloy having an amount of niobium (Nb) within a range of about 5% and 15% niobium (Nb) by mass.

15. The coaxial thermocouple of claim 7, wherein the sheath comprises a niobium-molybdenum alloy having an amount of molybdenum (Mo) within a range of about 5% and 15% niobium (Nb) by mass.

16. The coaxial thermocouple of claim 7, wherein the insulation layer comprises one or more of Alumina ($Al_2O_3$), Magnesia (MgO), Hafnia ($HfO_2$), Silica ($SiO_2$), Zirconia ($ZrO_2$), or Yttria ($Y_2O_3$).

17. The coaxial thermocouple of claim 7, electrical junction comprising a swaged end with an outer diameter of the sheath reducing in diameter along a longitudinal length of the coaxial thermocouple until the sheath contacts the wire within the insulation layer.

18. A method of forming a coaxial thermocouple, comprising:
   heating a wire and a sheath of the coaxial thermocouple to at least 1400° C.;
   maintaining a temperature of the wire and the sheath of the coaxial thermocouple to achieve one or more of a time period elapsing or the coaxial thermocouple exhibiting a desired fitted electromotive force (EMF) curve; and swaging the sheath onto the wire.

19. The method of claim 18, wherein the time period comprises at least five hours.

20. The method of claim 18, wherein the desired fitted electromotive force (EMF) curve comprises a desired fitted electromotive force (EMF) curve that reaches a d(Voltage)/d(time[hr]) of less than 0.001 at operating temperatures above 1400° C.

* * * * *